United States Patent
Nishikawa et al.

(10) Patent No.: US 11,855,659 B2
(45) Date of Patent: *Dec. 26, 2023

(54) ISOLATOR

(71) Applicants: Kabushiki Kaisha Toshiba, Tokyo (JP); Toshiba Electronic Devices & Storage Corporation, Tokyo (JP)

(72) Inventors: Masaki Nishikawa, Yokohama Kanagawa (JP); Shoji Ootaka, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/072,070

(22) Filed: Nov. 30, 2022

(65) Prior Publication Data

US 2023/0090444 A1     Mar. 23, 2023

Related U.S. Application Data

(63) Continuation of application No. 17/463,315, filed on Aug. 31, 2021, now Pat. No. 11,539,376.

(30) Foreign Application Priority Data

Mar. 24, 2021 (JP) .................................. 2021-050719

(51) Int. Cl.
    H03M 3/00    (2006.01)
(52) U.S. Cl.
    CPC .......... *H03M 3/464* (2013.01); *H03M 3/344* (2013.01); *H03M 3/466* (2013.01)

(58) Field of Classification Search
    CPC ....... H03M 3/464; H03M 3/344; H03M 3/466
    USPC .......................................................... 343/143
    See application file for complete search history.

(56) References Cited

U.S. PATENT DOCUMENTS

| | | | |
|---|---|---|---|
| 6,330,330 B2 | 12/2001 | Scott et al. | |
| 6,389,063 B1* | 5/2002 | Kanekawa | H04L 1/0045 |
| | | | 330/10 |
| 6,875,178 B2* | 4/2005 | Phelps | B06B 1/0622 |
| | | | 600/447 |
| 7,936,296 B2* | 5/2011 | Kibune | H03M 1/205 |
| | | | 341/155 |
| 11,223,367 B2* | 1/2022 | Jang | H04B 1/123 |

(Continued)

OTHER PUBLICATIONS

Technical Notes, The Avago Advantage (2012).

*Primary Examiner* — Jean B Jeanglaude
(74) *Attorney, Agent, or Firm* — Allen & Overy LLP

(57) ABSTRACT

An isolator of embodiments includes a ΔΣ analog-digital converter configured to convert an analog signal into a digital signal of one bit and transmit the digital signal of one bit as normal data, a time direction multiplexing circuit configured to perform time direction multiplexing of alternately performing conversion of the normal data into a digital differential signal and transmission of the digital differential signal, and transmission of a special signal different from the normal data, and an insulated transmission circuit configured to transmit the digital differential signal and the special signal transmitted from the time direction multiplexing circuit via an insulating layer.

9 Claims, 14 Drawing Sheets

(56) References Cited

U.S. PATENT DOCUMENTS

| | | | |
|---|---|---|---|
| 2004/0002652 A1* | 1/2004 | Phelps | A61B 8/483 |
| | | | 600/459 |
| 2006/0187971 A1* | 8/2006 | Lum | H04L 25/0276 |
| | | | 370/535 |
| 2010/0014607 A1* | 1/2010 | Kibune | H03M 1/108 |
| | | | 341/155 |
| 2011/0050472 A1 | 3/2011 | Melanson | |
| 2016/0308698 A1 | 10/2016 | Talty et al. | |
| 2017/0127006 A1* | 5/2017 | Lee | H04N 25/772 |
| 2021/0250040 A1* | 8/2021 | Jang | H04B 1/123 |

* cited by examiner

ISOLATOR

CROSS-REFERENCE TO RELATED APPLICATIONS

This application is based on application Ser. No. 17/463,315 filed Aug. 31, 2021 and based upon and claims the benefit of priority from the prior Japanese Patent Application No. 2021-050719 filed in Japan on Mar. 24, 2021; the entire contents of which are incorporated herein by reference.

FIELD

Embodiments described herein relate generally to an isolator.

BACKGROUND

A motor is connected to a control apparatus via an isolator when, for example, the motor as target equipment is controlled by the control apparatus. At the isolator, an insulating layer is provided between an input side and an output side, and a signal of a current/voltage or the like, detected at the motor is safely transmitted to the control apparatus side.

The isolator is separated into, for example, a primary circuit on the input side and a secondary circuit on the output side across the insulating layer. The primary circuit converts an analog signal input from the target equipment into a digital signal, modulates the digital signal and transmits the modulated digital signal to the insulating layer. The secondary circuit demodulates data transmitted via the insulating layer and outputs the demodulated data to the control apparatus side.

In this event, the primary circuit of the isolator employs, for example, a delta sigma analog-digital converter ($\Delta\Sigma$ ADC) as a configuration for converting an analog input signal into a digital signal. The $\Delta\Sigma$ ADC is a circuit which converts the analog signal into a pulse sequence in accordance with an amplitude of the analog signal by oversampling and performing $\Delta\Sigma$ modulation to quantize the analog signal, and outputs the pulse sequence. The output signal of the $\Delta\Sigma$ ADC has quantization noise which is unevenly distributed on a high frequency side by $\Delta\Sigma$ modulation, and thus, the quantization noise can be favorably removed by applying a low-pass filter.

By the way, when an abnormal state such as excessive input occurs at the isolator, it is desired to stop operation of the target equipment in a time period as short as possible. However, an output of the $\Delta\Sigma$ ADC is a data sequence of one bit, and thus, it is not until data of a plurality of bits is acquired that whether or not an amplitude of an input signal is large can be determined. On the other hand, providing a dedicated transmission path for transmitting data indicating an abnormal state at the isolator increases a circuit area and current consumption.

DETAILED DESCRIPTION

Comparative examples will be described first before embodiments are described with reference to the drawings.

First Comparative Example

Figure 1:
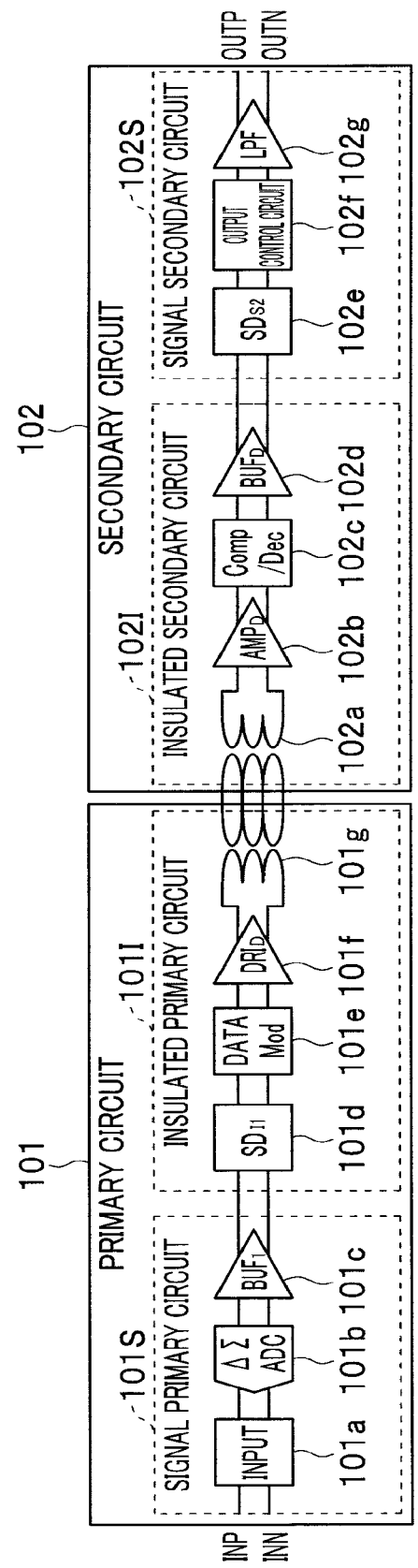
FIG. 1 is a view illustrating a configuration of an isolator according to a first comparative example.

FIG. 1 is a view illustrating a configuration of an isolator according to a first comparative example.

The isolator is an isolation amplifier including a primary circuit 101 located on an input side and a secondary circuit 102 located on an output side across an insulating layer. The primary circuit 101 includes a signal primary circuit 101S on the input side and an insulated primary circuit 101I on an insulation side. The secondary circuit 102 includes an insulated secondary circuit 102I on the insulation side and a signal secondary circuit 102S on the output side.

Note that while an example will be described in FIG. 1 and FIG. 2 and FIG. 3 which will be described later, where the primary circuit is constituted with two chips of the signal primary circuit and the insulated primary circuit, and the secondary circuit is constituted with two chips of the signal secondary circuit and the insulated secondary circuit, a configuration is not limited to the example. For example, the whole of the primary circuit may be constituted with one chip, and the whole of the secondary circuit may be constituted with one chip.

While not illustrated, equipment (target equipment) such as a motor for which a current/voltage, or the like, is to be detected is connected to the input side of the isolator. Further, a control apparatus for controlling the target equipment is connected to the output side of the isolator by way of, for example, an external low-pass filter, or the like.

An analog input signal from the target equipment is input to input terminals INP and INN of the signal primary circuit 101S of the isolator. Normally, the input terminal INN on a negative side is grounded, and thus, a signal representing a state of the target equipment is input to the input terminal INP on a positive side. The analog input signal from the input terminals INP and INN is amplified with a predetermined gain by an input stage preamplifier (INPUT) 101a. The analog input signal amplified by the input stage preamplifier 101a is input to a ΔΣ (delta sigma) analog-digital converter (ΔΣ ADC) 101b. The ΔΣ ADC 101b performs ΔΣ modulation on the analog input signal to convert the analog input signal into a digital data sequence of one bit and outputs the digital data sequence of one bit. The data of one bit output from the ΔΣ ADC 101b is output to the insulated primary circuit 101I from an output buffer (BUF$_1$) 101c of the signal primary circuit 101S.

The insulated primary circuit 101I imports the data of one bit output from the signal primary circuit 101S from a signal detector (SD$_{f1}$) 101d and modulates the data by a data modulator (DATA Mod) 101e. The data modulator 101e performs data modulation on the data of one bit to transmit the data of one bit from the insulated primary circuit 101I to the insulated secondary circuit 102I. The modulated data obtained by modulating the data of one bit by the data modulator 101e is output to a transformer primary coil 101g from a driver (DRIB) 101f. The transformer primary coil 101g transmits a magnetic signal in accordance with the modulated data to the secondary circuit 102 side.

Note that while an example will be described in FIG. 1 and FIG. 2, FIG. 3, or the like, which will be described later where signal transmission is performed in a wireless manner at the insulating layer using a magnetic insulation scheme using a coil, the scheme is not limited to the magnetic insulation scheme. Signal transmission in a wireless manner at the insulating layer may be performed using, for example, a capacitive insulation scheme using a capacitor, or may be performed using an optical insulation scheme using a light emitting device and a phototransistor.

The secondary circuit 102 receives a magnetic signal from the transformer primary coil 101g at a transformer secondary coil 102a of the insulated secondary circuit 102I and converts the magnetic signal into an electrical signal. The modulated data converted into the electrical signal is amplified by an amplifier (AMP$_D$) 102b and demodulated to data of one bit by a demodulator (Comp/Dec) 102c. The demodulated data of one bit is output to the signal secondary circuit 102S via a buffer (BUFF) 102d.

A signal detector (SD$_{S2}$) 102e of the signal secondary circuit 102S imports the data of one bit output from the insulated secondary circuit 102I. The output control circuit 102f determines whether the data of one bit imported by the signal detector (SD$_{S2}$) 102e is normal output data (normal data) or output data for which an abnormality such as excessive input is detected. The output control circuit 102f further adjusts a timing in accordance with a determination result and outputs the data of one bit to a low-pass filter circuit (LPF) 102g. The LPF 102g converts a data sequence of one bit demodulated by the demodulator 102c into an analog signal, applies a predetermined low-pass filter and outputs the analog signal which has passed though the low-pass filter from output terminals OUTP and OUTN.

In a case where an abnormal state such as excessive input occurs at the isolator, it is desired to stop operation of the target equipment in a time period as short as possible. However, an output of the ΔΣ ADC 101b is a data sequence of one bit, and it is not until data of a plurality of bits is acquired that whether or not an amplitude of an input signal is large can be determined. Normally, a signal detector using a narrow bandpass filter is disposed after the output terminals OUTP and OUTN of the isolator illustrated in FIG. 1 so as to obtain a high signal to noise ratio (SNR). The signal detector requires a delay time period of, for example, approximately several tens μs to perform determination. By preparing both a high SNR detector using a narrow bandpass filter and a low SNR detector which does not use a narrow bandpass filter as the signal detector, it is possible to shorten the delay time period to perform determination to, for example, approximately 2 μs by using the low SNR detector. However, there is a case where a device using silicon carbide (SiC), or the like, having high dielectric breakdown electric field strength, high saturation electron speed, high thermal conductivity, or the like, is broken down in a time period of several microseconds due to excessive input, and thus, a delay time period of the isolator is desired to be equal to or less than 1 μs.

Second Comparative Example

Figure 2:
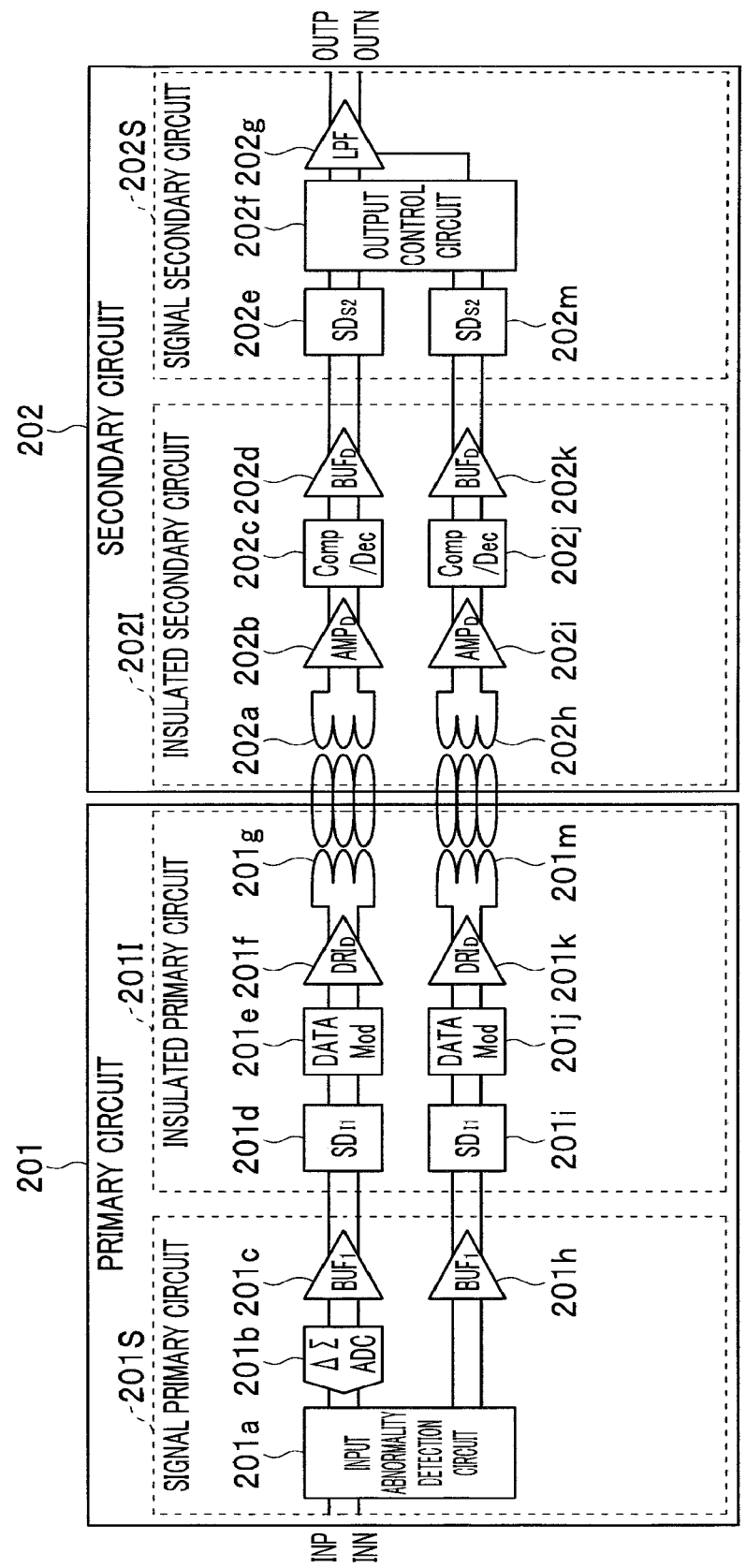
FIG. 2 is a view illustrating a configuration of an isolator according to a second comparative example.

FIG. 2 is a view illustrating a configuration of an isolator according to a second comparative example. FIG. 2 illustrates an example of the configuration where information in which an abnormal state such as excessive input occurs is transmitted with a short delay time period within the isolator.

The isolator in the second comparative example includes a first primary circuit 201 including a signal primary circuit 201S and an insulated primary circuit 201I, and a secondary circuit 202 including an insulated secondary circuit 202I and a signal secondary circuit 202S. The primary circuit 201 receives an input of an analog input signal from input terminals INP and INN. The secondary circuit 202 outputs an analog signal from output terminals OUTP and OUTN.

The signal primary circuit 201S includes an input stage preamplifier (INPUT), an abnormality detection circuit 201a, a ΔΣ ADC 201b, an output buffer 201c, and an output buffer 201h. The ΔΣ ADC 201b and the output buffer 201c are respectively constituted in a similar manner to the ΔΣ ADC 101b and the output buffer 201c in FIG. 1.

The insulated primary circuit 201I includes a signal detector 201d, a data modulator 201e, a driver 201f, a transformer primary coil 201g, a signal detector 201i, a data modulator 201j, a driver 201k, and a transformer primary coil 201m. The signal detector 201d, the data modulator 201e, the driver 201f and the transformer primary coil 201g are respectively constituted in a similar manner to the signal detector 101d, the data modulator 101e, the driver 101f and the transformer primary coil 101g in FIG. 1.

The insulated secondary circuit 202I includes a transformer secondary coil 202a, an amplifier 202b, a demodulator 202c, a buffer 202d, a transformer secondary coil 202h, an amplifier 202i, a demodulator 202j and a buffer 202k. The transformer secondary coil 202a, the amplifier 202b, the demodulator 202c and the buffer 202d are respectively constituted in a similar manner to the transformer secondary coil 102a, the amplifier 102b, the demodulator 102c and the buffer 102d in FIG. 1.

The signal secondary circuit 202S includes a signal detector 202e, an output control circuit 202f, a low-pass filter circuit 202g and a signal detector 202m. The signal detector 202e is constituted in a similar manner to the signal detector 102e in FIG. 1.

The input stage preamplifier and the abnormality detection circuit 201a of the signal primary circuit 201S determine whether or not the analog input signal from the input terminals INP and INN is excessive input and generate and output a determination signal as well as operating as the input stage preamplifier. Whether or not the analog input signal is excessive input (for example, an excessive voltage) is determined by, for example, comparing an amplitude (for example, a voltage) of the analog input signal with a threshold.

The determination signal output from the input stage preamplifier and the abnormality detection circuit 201a is output to the insulated primary circuit 201I by way of the output buffer 201h. Thus, the determination signal is transmitted to the insulated primary circuit 201I without going through the ΔΣ ADC 201b. The insulated primary circuit 201I imports the determination signal output from the signal primary circuit 201S from the signal detector 201i and modulates the determination signal at the data modulator 201j. The data modulator 201j modulates data of the determination signal to transmit the determination signal from the insulated primary circuit 201I to the insulated secondary circuit 202I. The determination signal (modulated determination signal) modulated by the data modulator 201j is output to the transformer primary coil 201m by the driver 201k. The transformer primary coil 201m transmits a magnetic signal in accordance with the modulated determination signal to the secondary circuit 202 side.

The secondary circuit 202 receives the magnetic signal from the transformer primary coil 201m at the transformer secondary coil 202h of the insulated secondary circuit 202I and converts the magnetic signal into an electrical signal. The modulated determination signal converted into the electrical signal is amplified by the amplifier 202i and demodulated to the determination signal by the demodulator 202j. The demodulated determination signal is output to the signal secondary circuit 202S via the buffer 202k.

The signal secondary circuit 202S imports the determination signal output from the insulated secondary circuit 202I by the signal detector 202m. The output control circuit 202f receives an input of the determination signal imported by the signal detector 202m and in a case where the determination signal is a signal indicating excessive input, recognizes excessive input. Then, the output control circuit 202f controls the low-pass filter circuit 202g and causes the low-pass filter circuit 202g to output the analog signal indicating excessive input to the output terminals OUTP and OUTN. Alternatively, a dedicated output terminal different from the output terminals OUTP and OUTN may be provided at the secondary circuit 202, and the output control circuit 202f may output the analog signal indicating excessive input from the dedicated output terminal.

In this manner, in the configuration in FIG. 2, a transmission path which transmits the determination signal from the signal primary circuit 201S to the signal secondary circuit 202S is provided separately from a transmission path which transmits normal data by way of the ΔΣ ADC 201b. The determination signal can be transmitted from the signal primary circuit 201S to the signal secondary circuit 202S with a short delay time period by preventing the determination signal from going through the ΔΣ ADC 201b. However, the isolator having the configuration in FIG. 2 requires transmission paths of two systems, which substantially increases a circuit area and current consumption compared to a circuit area and current consumption of the isolator having the configuration in FIG. 1.

Thus, an isolator which transmits data different from normal data in a shorter delay time period than a delay time period of the normal data without substantially increasing a circuit area and current consumption will be described in the following embodiments.

The isolator of the embodiments includes a ΔΣ analog-digital converter configured to convert an analog input signal into a digital signal of one bit and transmits the digital signal as normal data, a time direction multiplexing circuit configured to perform time direction multiplexing of alternately performing conversion of the normal data from the ΔΣ analog-digital converter into a digital differential signal and transmission of the digital differential signal, and transmission of a special signal different from output of the ΔΣ analog-digital converter, and an insulated transmission circuit configured to transmit the digital differential signal and the special signal transmitted from the time direction multiplexing circuit via an insulating layer.

First Embodiment

Figure 3:
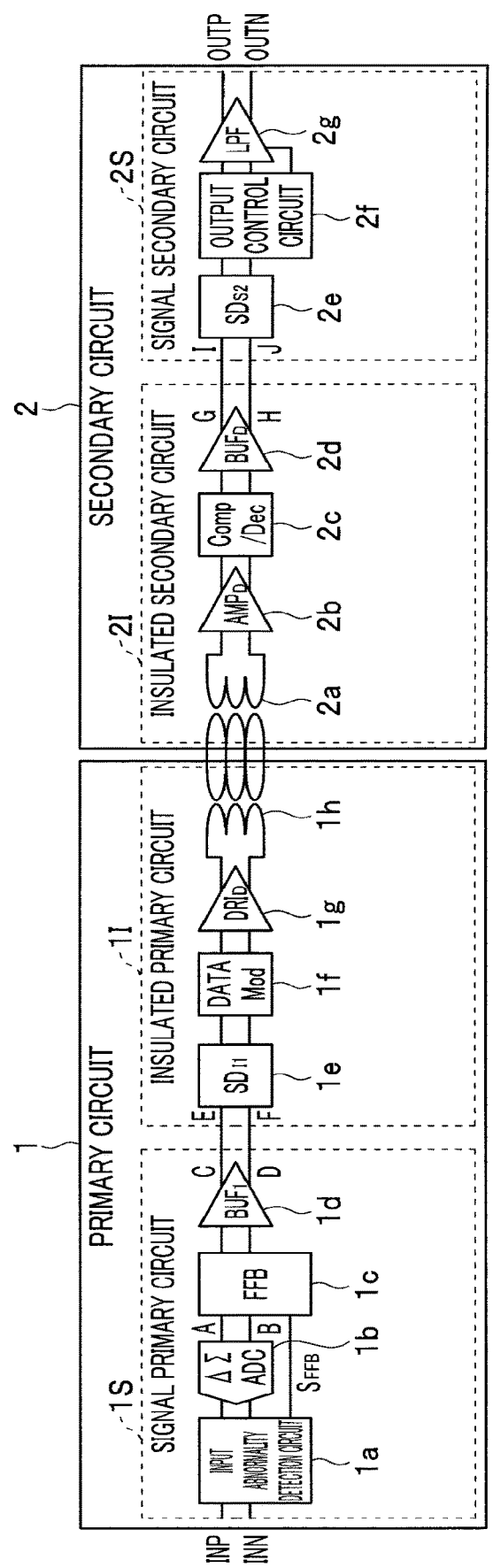
FIG. 3 is a view illustrating a configuration of an isolator according to a first embodiment.

FIG. 3 is a view illustrating a configuration of an isolator according to a first embodiment. As can be seen from comparison between FIG. 3, and FIG. 1 and FIG. 2, the isolator of the present embodiment does not include transmission paths of two systems as provided in the isolator in FIG. 2, and basically includes a transmission path of one system in a similar manner to the isolator in FIG. 1. Thus, most components of the isolator in FIG. 3 are similar to the components of the isolator in FIG. 1.

In other words, the isolator of the present embodiment is an isolation amplifier which includes a primary circuit 1 located on an input side and a secondary circuit 2 located on an output side across an insulating layer. The primary circuit 1 includes a signal primary circuit 1S on the input side, and an insulated primary circuit 1I on an insulation side. The secondary circuit 2 includes an insulated secondary circuit 2I on the insulation side and a signal secondary circuit 2S on the output side. The insulated primary circuit 1I and the insulated secondary circuit 2I constitute an insulated transmission circuit and transmit a differential signal from the signal primary circuit 1S via the insulating layer. As described above, while a configuration is assumed in the present embodiment where the signal primary circuit 1S, the insulated primary circuit 1I, the insulated secondary circuit 2I and the signal secondary circuit 2S are respectively constituted with one chip, the configuration is not limited to the configuration.

Figure 4:
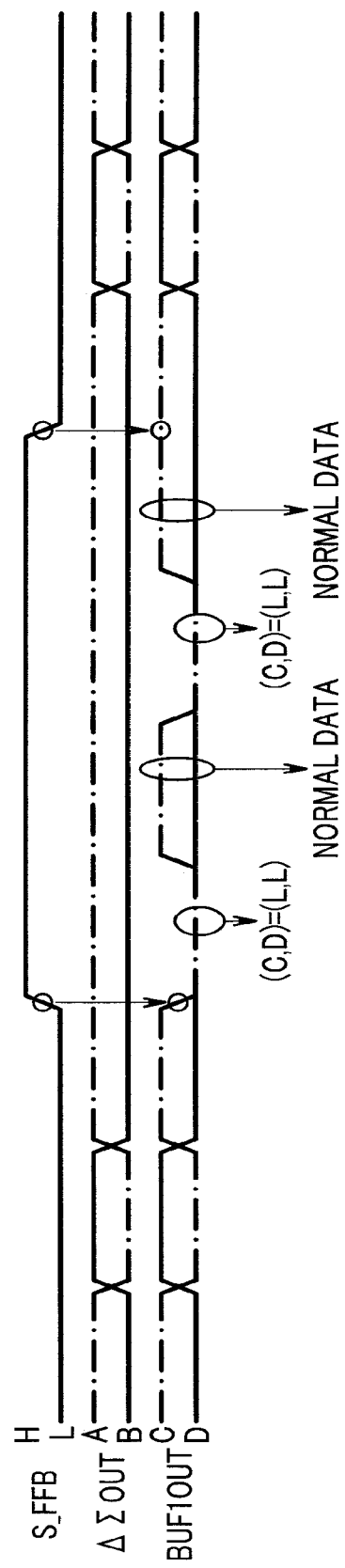
FIG. 4 is a timing chart for explaining signal transmission at a signal primary circuit and an insulated primary circuit of the isolator according to the first embodiment.
Figure 5:
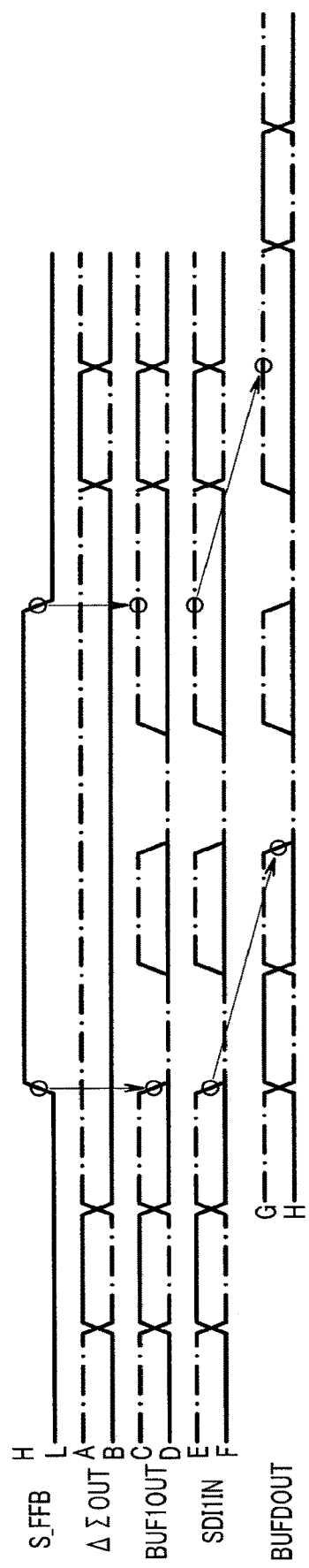
FIG. 5 is a timing chart for explaining signal transmission at the insulated primary circuit and an insulated secondary circuit of the isolator according to the first embodiment.
Figure 6:
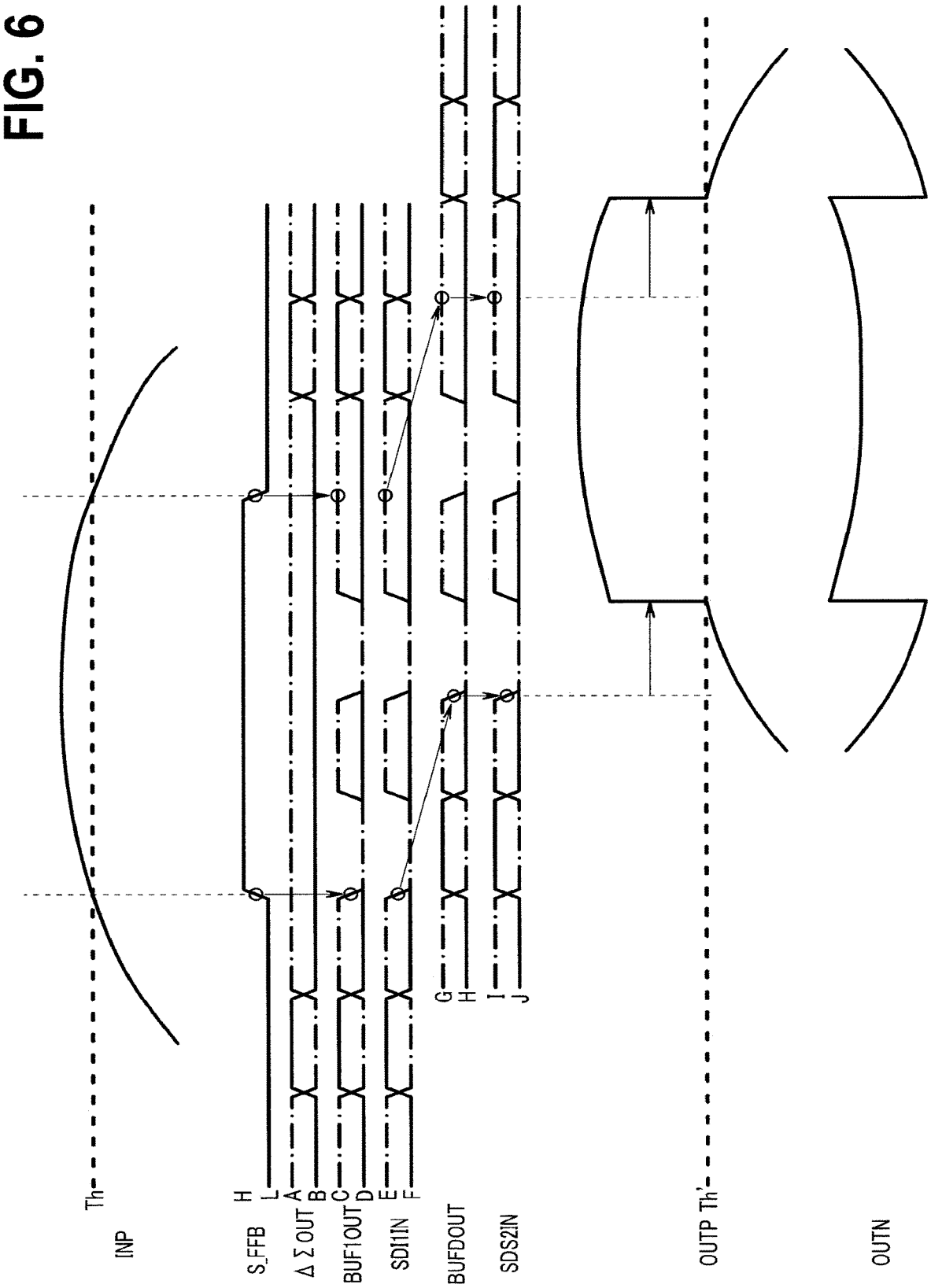
FIG. 6 is a timing chart for explaining output upon excessive input of the isolator according to the first embodiment.

A configuration of the isolator illustrated in FIG. 3 will be described with reference to timing charts in FIG. 4 to FIG. 6. FIG. 4 is a timing chart for explaining signal transmission at the signal primary circuit 1S and the insulated primary circuit 1I of the isolator according to the present embodiment. FIG. 5 is a timing chart for explaining signal transmission at the insulated primary circuit 1I and the insulated secondary circuit 2I of the isolator according to the present embodiment. FIG. 6 is a timing chart for explaining output upon excessive input of the isolator according to the present embodiment.

An analog signal output from the target equipment such as a motor is input to the input terminals INP and INN of the signal primary circuit 1S of the isolator. An input stage preamplifier (INPUT) and an abnormality detection circuit 1*a* determine whether or not the analog input signal from the input terminals INP and INN is excessive input. As described above, the input terminal INN on the negative side is normally grounded, and thus, the input stage preamplifier and the abnormality detection circuit 1*a* determine that the operation is normal operation in a case where an amplitude of the signal input from the input terminal INP on the positive side is equal to or less than an excessive input threshold Th, and determine that excessive input occurs in a case where the amplitude is greater than the excessive input threshold Th (see INP in FIG. 6). The input stage preamplifier and the abnormality detection circuit 1*a* generate and output an L (low level) (digital value "0") as a determination signal $S_{FFB}$ in a case where it is determined that the operation is normal operation and generate and output an H (high level) (digital value "1") as the determination signal $S_{FFB}$ in a case where it is determined that excessive input occurs (see S_FFB in FIG. 4 to FIG. 6).

Further, the input stage preamplifier and the abnormality detection circuit 1*a* amplify the analog input signal from the input terminals INP and INN with a predetermined gain. The analog input signal amplified by the input stage preamplifier and the abnormality detection circuit 1*a* is input to the ΔΣ (delta sigma) analog-digital converter (ΔΣ ADC) 1*b*. The ΔΣ ADC 1*b* performs ΔΣ modulation on the analog input signal to convert the analog input signal into a data sequence of one bit and outputs the data sequence of one bit. Two outputs A and B of the ΔΣ ADC 1*b* are digital differential signals, one of which is an H and the other is an L (H/L), or one of which is an L and the other is an H (L/H) (see ΔΣ OUT in FIG. 4 to FIG. 6). The signal of one bit output from the ΔΣ ADC 1*b* is input to a fast feedback processing circuit (FFB) 1*c*.

The FFB 1*c* receives an input of the determination signal $S_{FFB}$ from the input stage preamplifier and the abnormality detection circuit 1*a*. The FFB 1*c* outputs the output of the ΔΣ ADC 1*b* as is to the output buffer ($BUF_1$) 1*d* in a case where the determination signal $S_{FFB}$ is an L (indicating normal operation). Thus, two outputs C and D of the output buffer 1*d* become H/L or L/H (see BUF1OUT corresponding to a portion where S_FFB is an L in FIG. 4 to FIG. 6).

On the other hand, in a case where the determination signal $S_{FFB}$ is an H (indicating excessive input), the FFB 1*c* alternately outputs normal data of the ΔΣ ADC 1*b* and special data (special signal) different from the output of the ΔΣ ADC 1*b* (which cannot be output of the ΔΣ ADC 1*b*) for each clock. Here, two outputs of the normal data of the ΔΣ ADC 1*b* become H/L or L/H. Thus, the FFB 1*c* outputs L/L or H/H as special data which is neither H/L nor L/H (hereinafter, while a case will be described where the special data is L/L, the special data may be H/H in place of L/L). As a result, the two outputs C and D of the output buffer 1*d* alternately become normal data and special data for each clock (see BUF1OUT corresponding to a portion where S_FFB is an H in FIG. 4 to FIG. 6).

The determination signal $S_{FFB}$ is directly input from the input stage preamplifier and the abnormality detection circuit 1*a* to the FFB 1*c* without going through the ΔΣ ADC 1*b*, and the FFB 1*c* puts the special data between normal data on every other clock and transmits the data in a case where the determination signal $S_{FFB}$ is an H. Thus, the special data is transmitted by bypassing the ΔΣ ADC 1*b* in a case where it is determined that excessive input occurs.

Note that data other than the normal data is used to detect an abnormality at the isolator. For example, in a case where the signal primary circuit 1S is in a power-off state, the two outputs C and D of the output buffer 1*d* become continuous L/L, and two inputs I and J of the signal detector ($SD_{S2}$) 2*e* of the signal secondary circuit 2S become L/L. In a similar manner, also in a case where the insulated primary circuit 1I or the insulated secondary circuit 2I is in a power-off state, the two inputs I and J of the signal detector 2*e* of the signal secondary circuit 2S become L/L.

Thus, in a case where the signal secondary circuit 2S receives initial L/L as the inputs I and J, the output control circuit 2*f* cannot determine whether the L/L indicates that one or more of the signal primary circuit 1S, the insulated primary circuit 1I and the insulated secondary circuit 2I is in a power-off state, or indicates that the signal primary circuit 1S detects excessive input.

However, in a case where the signal secondary circuit 2S receives H/L or L/H as the inputs I and J in the next clock, the output control circuit 2*f* can determine that the signal primary circuit 1S detects excessive input. On the other hand, in a case where the signal secondary circuit 2S successively receives L/L as the inputs I and J in the next clock, the output control circuit 2*f* can determine that one or more of the signal primary circuit 1S, the insulated primary circuit 1I and the insulated secondary circuit 2I is in a power-off state.

Note that use of H/H as special data enables the output control circuit 2*f* to determine not that one or more of the signal primary circuit 1S, the insulated primary circuit 1I and the insulated secondary circuit 2I is in a power-off state (L/L), but that the signal primary circuit 1S detects excessive input, at a time point at which initial H/H is received.

In this manner, the FFB 1*c* generates an L/L signal (or an H/H signal) every other clock in a time direction so as to enable excessive input to be distinguished from the power-off states of the signal primary circuit 1S, the insulated primary circuit 1I and the insulated secondary circuit 2I. Such a technology of multiplexing a plurality of signals in time division (that is, in a time direction) and transmitting the multiplexed signals (signal multiplexing technology in a time direction) will be referred to as time-direction coding (coding). The FFB 1*c* is a time direction multiplexing circuit which performs time direction multiplexing.

Signal transmission between chips of the signal primary circuit 1S and the insulated primary circuit 1I, and signal transmission between chips of the insulated secondary circuit 2I and the signal secondary circuit 2S are performed in a wired manner. Further, signal transmission between chips of the insulated primary circuit 1I and the insulated secondary circuit 2I is performed in a wireless manner via a transformer. When normal data is transmitted between chips, it is necessary to use a differential signal of complementary two inputs and two outputs (so-called, differential signal 2 pin) to use time-direction coding both in a case of signal transmission in a wired manner and in a case of signal transmission in a wireless manner. In other words, use of a differential signal of H/L or L/H as normal data enables transmission of L/L or H/H as special data through time-direction coding.

Typically, in the time-direction coding, two or more types of data Di (where i indicates a type of data, and i=1, 2, . . . ) can be transmitted in time division. For example, in a case where i=2, if it is assumed that k indicates a number of an operation clock, data D1 of a first type and data D2 of a second type are alternately transmitted for each operation clock, like D1(k), D2(k+1), D1(k+2), D2(k+3), . . . . In this event, data which cannot be transmitted in time division, here, D2(k), D1(k+1), D2(k+2), D1(k+3), . . . , are, for example, discarded without any processing being performed.

In a case where, for example, two types of data are transmitted assuming that the data D1 of the first type is normal data, data D2(k+1), D2(k+3), ..., of the second type which are periodically repeated is special data. By detecting special data for each predetermined cycle, it is possible to determine that two types of data are transmitted.

In a case where three or more types of data are transmitted, it is possible to determine that three or more types of data are transmitted through detection of special data in a similar manner. It is assumed that there are m types of the special data, where m is an integer equal to or greater than 2. In this event, the time direction multiplexing circuit alternately performs conversion of normal data into a digital differential signal and transmission of the digital differential signal in one operation clock, and transmission of the m types of the special data in m operation clocks. The m types of special data are transmitted in determined order. In this case, i=(m+1), and thus, data is transmitted in order of D1(k), D2(k+1), D3(k+2), ..., D(m+1)(k+m), D1(k+m+1), D2(k+m+2) ....

In this manner, in the present embodiment, normal data D1 is transmitted in a case where excessive input does not occur, and two or more types of data Di (i=1, 2, ...) are transmitted through time-direction coding in a case where it is necessary to transmit two or more types of data due to excessive input, or the like.

The output buffer 1*d* outputs the signal input from the FFB 1*c* to the insulated primary circuit 1I.

The insulated primary circuit 1I imports the signal output from the signal primary circuit 1S from the signal detector (SD$_{I1}$) 1*e*. Here, while the two inputs E and F of the insulated primary circuit 1I are delayed behind the two outputs C and D of the signal primary circuit 1S by a time period required for transmission between chips, FIG. 5 illustrates the time chart assuming that there is no delay.

The data modulator (DATA Mod) 1*f* performs data modulation on the signal imported from the signal detector 1*e* to transmit the signal from the insulated primary circuit 1I to the insulated secondary circuit 2I. The modulated data obtained by modulating the signal imported from the signal detector 1*e* by the data modulator 1*f* is output to the transformer primary coil 1*h* by a driver (DRIB) 1*g*. The transformer primary coil 1*h* transmits a magnetic signal in accordance with the modulated data to the secondary circuit 2 side.

Note that in a case where a signal is transmitted from the insulated primary circuit 1I to the insulated secondary circuit 2I, in a case where the signal detector 1*e* receives L/L, by preventing the insulated primary circuit 1I from transmitting data to the insulated secondary circuit 2I, the insulated secondary circuit 2I substantially receives an L/L signal. Thus, a receiver which interprets a case where a signal from the insulated primary circuit 1I cannot be detected within a predetermined time period, as a state where an L/L signal has been received, may be mounted on an actual insulated secondary circuit 2I.

The secondary circuit 2 receives the magnetic signal from the transformer primary coil 1*h* at the transformer secondary coil 2*a* of the insulated secondary circuit 2I and converts the magnetic signal into an electrical signal. The modulated data converted into the electrical signal is amplified by an amplifier (AMPS) 2*b* and demodulated to original data by the demodulator (Comp/Dec) 2*c*. The demodulated data is output to the signal secondary circuit 2S via a buffer (BUFF) 2*d*.

The two outputs G and H (see BUFDOUT in FIG. 5 and FIG. 6) of the insulated secondary circuit 2I are delayed by two clocks behind the two inputs E and F (see SD1IN in FIG. 5 and FIG. 6) of the insulated primary circuit 1I. In other words, the insulated secondary circuit 2I transmits a signal to the signal secondary circuit 2S while maintaining time-direction coding.

The signal secondary circuit 2S imports data output from the insulated secondary circuit 2I at the signal detector (SD$_{S2}$) 2*e*. The output control circuit 2*f* outputs the data imported from the signal detector 2*e* to a low-pass filter circuit (LPF) 2*g* by way of a data transmission path. Further, the output control circuit 2*f* is connected to the LPF 2*g* with a signal transmission path (notification line) different from the data transmission path.

The output control circuit 2*f* determines which of normal data which becomes H/L or L/H and special data which becomes L/L, the data imported from the signal detector 2*e* is. In a case where the output control circuit 2*f* determines that the data is normal data, the output control circuit 2*f* notifies the LPF 2*g* of a determination result indicating that the data is normal data by way of the notification line.

On the other hand, in a case where the output control circuit 2*f* determines that the data imported from the signal detector 2*e* is special data (L/L), the output control circuit 2*f* further performs determination on data imported in a next clock. In other words, the output control circuit 2*f* determines that excessive input occurs in a case where the data imported in the next clock is H/L or L/H and determines that an abnormal state other than excessive input occurs (one or more of the signal primary circuit 1S, the insulated primary circuit 1I and the insulated secondary circuit 2I is in a power-off state) in a case where the data is L/L. The output control circuit 2*f* determines whether excessive input occurs in a case where special data is detected, using data of successive two clocks in this manner.

In a case where the output control circuit 2*f* determines that excessive input occurs, the output control circuit 2*f* transmits a determination result indicating that excessive input occurs to the LPF 2*g* by way of the notification line.

The LPF 2*g* converts data (a data sequence of one bit) received from the output control circuit 2*f* by way of the data transmission path into an analog signal and applies a predetermined low-pass filter. In a case where the LPF 2*g* receives the determination result indicating that the data is normal data from the output control circuit 2*f*, the LPF 2*g* outputs the analog signal which has passed through the low-pass filter as a positive (+) signal from the output terminal OUTP and outputs the analog signal which has passed through the low-pass filter as a negative (−) signal from the output terminal OUTN. The signal output from the output terminal OUTP is different from the signal output from the output terminal OUTN only in polarity of the signal, and the signal output from the output terminal OUTP has the same common-mode voltage as a common mode voltage of the signal output from the output terminal OUTN.

In a case where the LPF 2*g* receives a determination result indicating that excessive input occurs from the output control circuit 2*f*, the LPF 2*g* shifts the common-mode voltage of the signals output from the output terminals OUTP and OUTN by, for example, an appropriate positive voltage at the same time (see OUTP and OUTN in FIG. 6).

The timing chart illustrated in FIG. 6 illustrates an example where when the LPF 2*g* receives H/L or L/H after the LPF 2*g* receives L/L, the LPF 2*g* shifts a common-mode signal at a time point at which rising of the received H/L or L/H is detected. However, there is also a case where shifting of the common-mode signal is delayed by further one clock due to a designed signal processing delay of the circuit after the LPF 2*g* receives H/L or L/H, depending on design of the LPF 2g. Note that while the common-mode voltage by the LPF 2g is typically shifted as rising of a voltage by a predetermined time constant, FIG. 6 illustrates an example of precipitous rising for which a time constant is not taken into account. Further, a threshold Th' indicated for the signal of the output terminal OUTP in FIG. 6 is a value corresponding to the excessive input threshold Th of the signal of the input terminal INP.

According to the first embodiment, by performing time-direction coding, it is possible to transmit special data other than normal data without providing a transmission path dedicated for special data within the isolator. As a result, it is possible to prevent a circuit area and current consumption of the isolator from substantially increasing.

In this event, in a case where the input stage preamplifier and the abnormality detection circuit 1a detect excessive input, the determination signal $S_{FFB}$ is transmitted to the FFB 1c without going through the ΔΣ ADC 1b, so that, data indicating that excessive input occurs can be transmitted in a short delay time period.

Further, in a case where excessive input is detected, the common-mode signal output from the LPF 2g is shifted, so that a signal indicating that excessive input occurs can be output from the output terminals OUTP and OUTN, which eliminates necessity of separately providing a dedicated output terminal.

Second Embodiment

Figure 7:
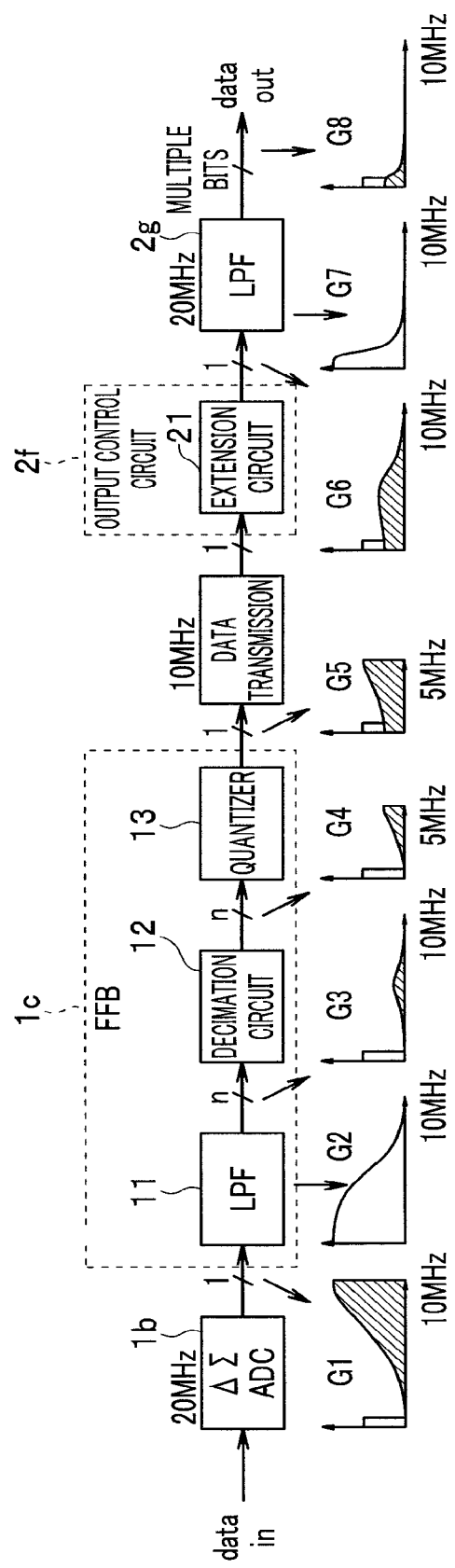
FIG. 7 is a view for explaining a technology for preventing quantization noise which is unevenly distributed on a high frequency side included in output of an $\Delta\Sigma$ ADC from folding on a low frequency side when the output of the $\Delta\Sigma$ ADC is decimated through time-direction coding according to a second embodiment.

FIG. 7 is a view for explaining a technology for preventing quantization noise which is unevenly distributed on a high frequency side included in the output of the ΔΣ ADC 1b from folding on a low frequency side in a case where the output of the ΔΣ ADC 1b is decimated through time-direction coding according to the second embodiment. In the second embodiment, the same reference numerals will be assigned to portions which are similar to portions in the first embodiment, description will be omitted, and different points will be mainly described.

The ΔΣ ADC 1b is a circuit which converts an analog signal into a pulse sequence in accordance with an amplitude of the analog signal by oversampling the analog signal and performing ΔΣ modulation to quantize the analog signal and outputs the pulse sequence. The quantization noise is unevenly distributed on a high frequency side through ΔΣ modulation, and thus, the quantization noise can be favorably removed by applying a low-pass filter.

However, in the first embodiment, the FFB 1c puts special data every other clock in a case where excessive input is detected, and thus, normal data output from the ΔΣ ADC 1b is data which is decimated every other clock. As a result, a frequency of the normal data becomes half, and quantization noise on a high frequency side folds on a low frequency side and overlaps a signal band on a low frequency side close to a direct current (DC). The decimated normal data is transmitted by way of an insulating layer, and then, extended by, for example, the same data being successively output in two clocks at an original frequency through zero insertion and filtering processing (which will be referred to as extension processing as appropriate). However, even if a low-pass filter is applied after the data is extended, the quantization noise folding in the signal band on the low frequency side cannot be removed, and thus, a signal to noise ratio (SNR) substantially degrades. An input signal to the ΔΣ ADC 1b gently changes and the SNR substantially degrades in a similar manner (see also FIG. 14 which will be described later).

However, the SNR substantially degrades in a case where the input signal to the ΔΣ ADC 1b is within an ADC range, that is, in a case where data output from the ΔΣ ADC 1b includes both H/L and L/H. In contrast, in a case where the input signal to the ΔΣ ADC 1b is outside the ADC range, data output from the ΔΣ ADC 1b is data including only successive H/L or data including only successive L/H. Thus, a quantization error does not occur in data output from the ΔΣ ADC 1b, and even if the data is decimated every other clock, the quantization noise does not fold and is not superimposed. Further, if the data is extended after the data is transmitted by way of the insulating layer, the data output from the ΔΣ ADC 1b is restored as is, which eventually eliminates influence of decimation. Thus, even if the input signal to the ΔΣ ADC 1b is within the ADC range, in a case where the input stage preamplifier and the abnormality detection circuit 1a are configured so as to detect excessive input, a technology for reducing quantization noise by the second embodiment (and a third embodiment which will be described later) becomes effective.

In the following description, the output signal of the ΔΣ ADC 1b will be expressed as ΔΣ(k), and a signal obtained by decimating every other ΔΣ(k) will be expressed as $\Delta\Sigma_{dcm}(2j+1)$. Here, k indicates a number of a clock, and k=(2j+1) (here, j is an integer). Further, it is assumed that ΔΣ(k) is a signal obtained by converting the input signal within the ADC range, and as indicated in a graph G1 in FIG. 7, quantization noise indicated with a hatched portion is unevenly distributed on a high frequency side of the signal band. Note that respective graphs G1, G3 to G6 and G8 indicate a frequency on a horizontal axis, indicate a relative value of power on a vertical axis, and separately indicate a signal and noise (so that noise appears on a front side) without values of the signal and the noise being added. Further, the graphs G2 and G7 indicate a frequency on a horizontal axis and indicate pass characteristics (relative passage rate) on a vertical axis.

A technology for preventing quantization noise which is unevenly distributed on a high frequency side from folding by decimation will be described with reference to FIG. 7.

The ΔΣ ADC 1b oversamples an analog input signal at 20 Mbps (signal components at equal to or less than 10 MHz), performs ΔΣ modulation to quantize the analog input signal, and, for example, outputs a signal ΔΣ(k) which is a pulse sequence of one bit at a frequency of 10 MHz.

The FFB 1c of the present embodiment includes a low-pass filter circuit (LPF) 11 as a noise suppression filter, a decimation circuit 12, and a quantizer 13.

The signal ΔΣ(k) from the ΔΣ ADC 1b is input to the LPF 11 of the FFB 1c. The LPF 11 has lowpass characteristics as indicated in the graph G2 in which a signal which passes through the LPF 11 attenuates from a low frequency side toward a high frequency side. The LPF 11 which implements such characteristics may have, for example, a circuit configuration which performs simple processing such as moving average. However, in moving average, addition, subtraction, or the like are performed within a circuit of the LPF 11, and thus, if n is set at an integer greater than 1, a signal output from the LPF 11 becomes n bits.

The signal output from the LPF 11 has a spectrum in which quantization noise which is unevenly distributed on the high frequency side in the graph G1 is reduced as indicated in the graph G3.

The decimation circuit 12 performs processing of decimating data to ½ by outputting the signal output from the LPF 11 every other bit and discarding bits which are not output. While the quantization noise which remains in a high frequency band of the signal $\Delta\Sigma_{dcm}(2j+1)$ folds as indicted in the graph G4 through the decimation processing, little quantization noise remains after the data passes through the LPF 11, and thus, the SNR does not substantially degrade compared to a case where the LPF 11 is not provided.

The quantizer 13 quantizes, for example, a signal of n bits of a frequency of 5 MHz output from the decimation circuit 12 to convert the signal of n bits into a signal of a data sequence of one bit of 10 Mbps (signal components of equal to or less than 5 MHz). The signal of one bit converted by the quantizer 13 will be expressed as $\Delta\Sigma_{RQdcm}(2j+1)$. Here, the quantizer 13 returns the signal to the signal of one bit again to avoid the necessity of an interface corresponding to n bits and avoid increase in current consumption due to transmission of data of n bits as is between chips.

The signal output from the quantizer 13 has a spectrum as indicated in the graph G5, in which the quantization noise which is flat on a frequency is added to a spectrum after decimation indicated in the graph G4. Thus, an SNR of the signal output from the quantizer 13 degrades compared to an SNR of the signal output from the decimation circuit 12. However, an SNR can be maintained higher than an SNR in a case where the output signal from the $\Delta\Sigma$ ADC 1b is decimated at the decimation circuit 12 as is without causing the output signal to go through the LPF 11.

Note that while FIG. 7 illustrates a configuration where the decimation circuit 12 is disposed before the quantizer 13, the order may be reversed, and the quantizer 13 may be disposed before the decimation circuit 12.

As described in the first embodiment, data is transmitted between chips with a signal in which L/L (for example, 5 MHz) of special data indicating that excessive input occurs, and normal data (for example, 5 MHz) of a data sequence of one bit output from the quantizer 13 are alternately arranged, for example, for each one clock of 10 MHz.

The signal $\Delta\Sigma_{RQdcm}(2j+1)$ of 5 MHz transmitted between chips is subjected to extension processing through zero insertion and filtering processing described above by, for example, an extension circuit 2I provided within the output control circuit 2f. The extension processing described here is, specifically, processing of outputting signals having the same bit value for each of two clocks, for example, "0" in synchronization with the clock of 10 MHz. The signal after the extension processing will be expressed as $\Delta\Sigma_{RQ}(j)$ in which a sampling frequency returns to 20 MHz which is the same frequency as a frequency of the output signal from the $\Delta\Sigma$ ADC 1b. As indicated in the graph G6, the quantization noise on the high frequency side is extended through the extension processing and a peak value becomes low.

The signal of one bit output from the extension circuit 2I is subjected to low-pass filter processing by the LPF 2g at an operation clock of 20 MHz. The LPF 2g has lowpass characteristics of passing only a signal in a signal band on a low frequency side close to a direct current (DC) and substantially cutting a signal in a band on a frequency side higher than the signal band, for example, as indicated in the graph G7.

While quantization noise remains in a signal band of a signal of multiple bits subjected to low-pass filter processing by the LPF 2g having such characteristics as indicated in the graph G8, other quantization noise is substantially suppressed. The processing result exhibits a higher SNR than an SNR in a case where the output signal from the $\Delta\Sigma$ ADC 1b is decimated as is at the decimation circuit 12 without passing through the LPF 11.

Figure 8:
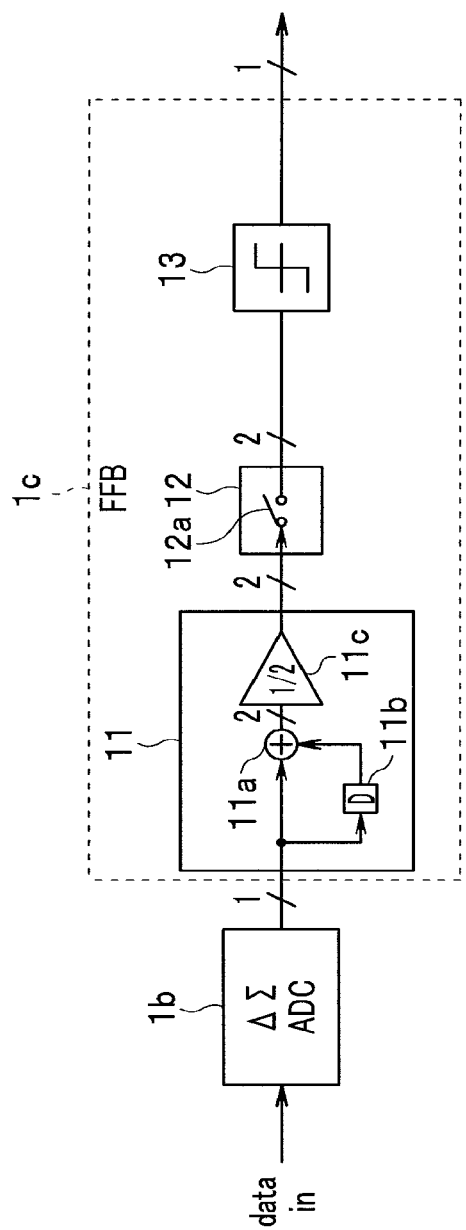
FIG. 8 is a view illustrating a configuration example of a fast feedback processing circuit (FFB) according to the second embodiment.

FIG. 8 is a view illustrating a configuration example of a fast feedback processing circuit (FFB) 1c according to the present embodiment.

The LPF 11 includes an adder 11a, a delay element 11b, and a ½-fold element 11c. The delay element 11b is disposed on a branch path branching from a transmission path from the $\Delta\Sigma$ ADC 1b to the adder 11a. An output of the delay element 11b is input to the adder 11a. The ½-fold element 11c is disposed after the adder 11a in series with the adder 11a.

The signal $\Delta\Sigma(k)$ of one bit output from the $\Delta\Sigma$ ADC 1b is input to the adder 11a and the delay element 11b. The delay element 11b delays the input signal by one clock and outputs the delayed signal. Thus, the adder 11a outputs a signal $\{\Delta\Sigma(k)+\Delta\Sigma(k-1)\}$ of two bits obtained by adding the signal $\Delta\Sigma(k)$ of a current clock and a signal $\Delta\Sigma(k-1)$ one clock before the current clock. The ½-fold element 11c multiplies the added signal $\{\Delta\Sigma(k)+\Delta\Sigma(k-1)\}$ output from the adder 11a by ½ through bit shift. In other words, FIG. 8 illustrates a configuration example of the LPF 11 which performs low-pass filter processing by moving average.

The signal of two bits of 20 Mbps output from the ½-fold element 11c of the LPF 11 is decimated every other bit by being input to the decimation circuit 12 and going through a switch 12a which is turned ON/OFF in synchronization with the clock of 10 MHz, and becomes a signal of two bits of 10 Mbps.

A data sequence of two bits output from the decimation circuit 12 is input to the quantizer 13 constituted as a one-bit quantizer and quantized to a signal $\Delta\Sigma_{RQdcm}(2j+1)$ of one bit. The FFB 1c subsequently alternately transmits the signal $\Delta\Sigma_{RQdcm}(2j+1)$ and L/L as described above.

According to the second embodiment, it is possible to provide substantially similar effects to the effects of the above-described first embodiment and reduce quantization noise after decimation by providing the LPF 11 before the decimation circuit 12, so that it is possible to prevent degradation of quality of data to be transmitted.

Third Embodiment

Figure 9:
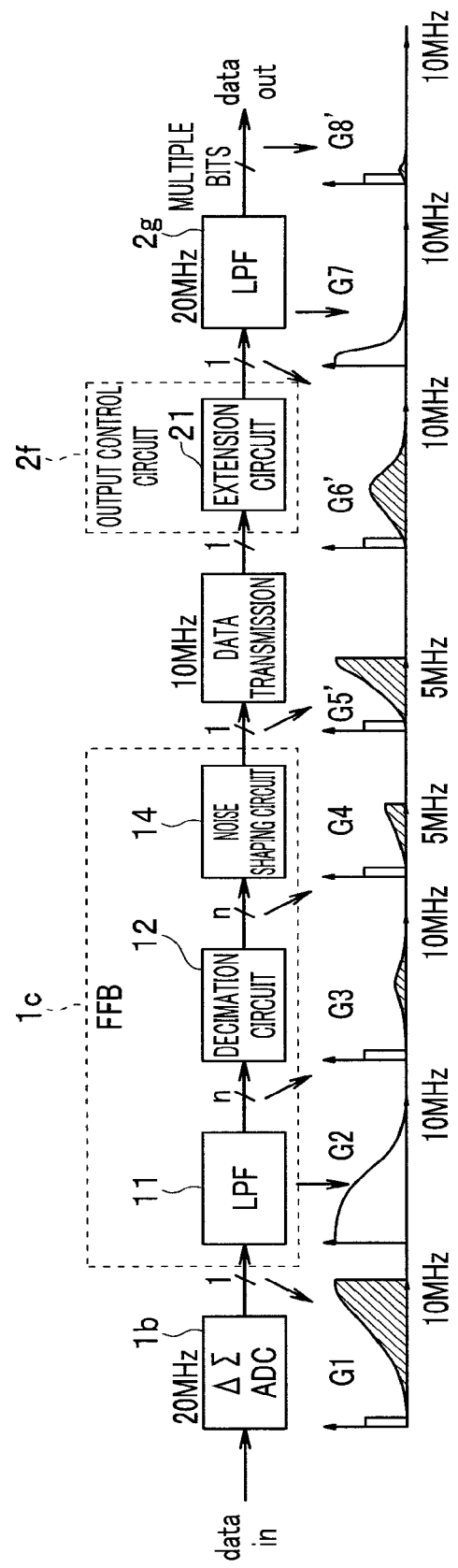
FIG. 9 is a view for explaining a technology for further preventing quantization noise which is unevenly distributed on a high frequency side included in output of an $\Delta\Sigma$ ADC 1b from folding on a low frequency side when the output of the $\Delta\Sigma$ ADC 1b is decimated through time-direction coding according to a third embodiment.

FIG. 9 is a view for explaining a technology for further preventing quantization noise which is unevenly distributed on a high frequency side included in output of the $\Delta\Sigma$ ADC 1b from folding on a low frequency side in a case where the output of the $\Delta\Sigma$ ADC 1b is decimated through time-direction coding, according to the third embodiment. In the third embodiment, the same reference numerals will be assigned to portions similar to portions in the first and the second embodiments, description will be omitted, and different points will be mainly described.

In the configuration illustrated in FIG. 9, the quantizer 13 of the FFB 1c in the configuration illustrated in FIG. 7 is replaced with a noise shaping circuit 14.

As will be specifically described later with reference to FIG. 10 and subsequent drawings, the noise shaping circuit 14 is a circuit which causes quantization noise to be unevenly distributed on a high frequency side by performing processing of adding a remainder (quantization error) when the input signal of n bits is quantized to a signal of one bit, to a signal to be input next in a similar manner to $\Delta\Sigma$ modulation.

The signal output from the quantizer 13 in FIG. 7 has a spectrum in which quantization noise which is flat on a frequency is added as indicated in the graph G5. In contrast, the signal output from the noise shaping circuit 14 in FIG. 9 has a spectrum in which an uneven distribution rate of the quantization noise on the high frequency side is higher as indicated in a graph G5'. By this means, the quantization noise in the signal band on the low frequency side indicated in the graph G5' is further reduced compared to the quantization noise in the graph G5 in FIG. 7.

As a result, as indicated in a graph G6', the quantization noise in the signal band on the low frequency side of the signal of one bit output from the extension circuit 2I is further reduced compared to the quantization noise in the graph G6 in FIG. 7. Thus, as indicated in a graph G8', the quantization noise of the signal subjected to low-pass filter processing by the LPF 2g is further reduced compared to the quantization noise in the graph G8 in FIG. 7, and the signal subjected to low-pass filter processing has a higher SNR.

Figure 10:
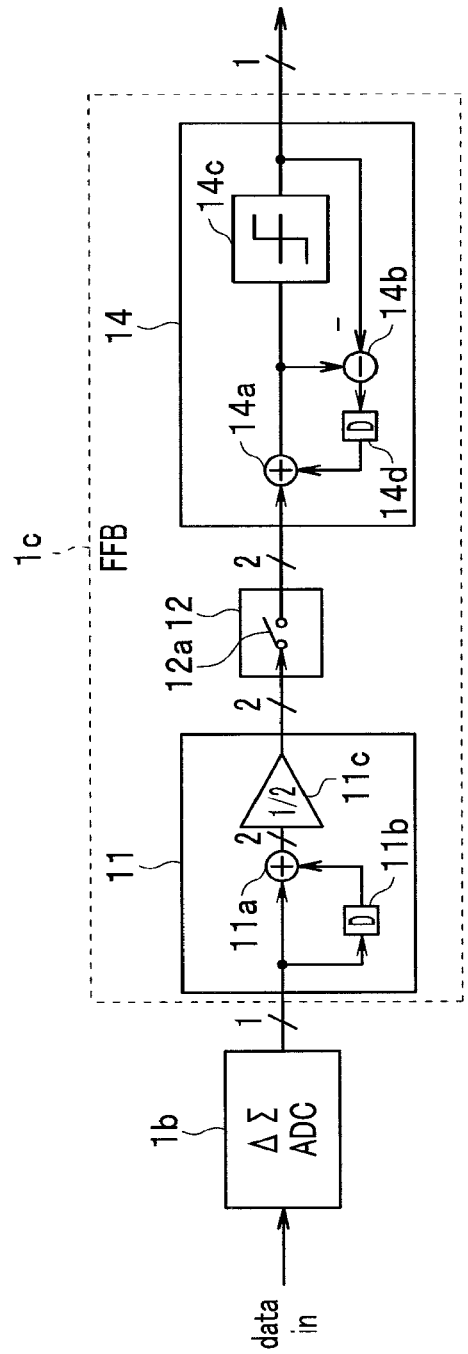
FIG. 10 is a view illustrating a first configuration example of a fast feedback processing circuit (FFB) according to the third embodiment.

FIG. 10 is a view illustrating a first configuration example of the fast feedback processing circuit (FFB) 1c according to the present embodiment.

Within the FFB 1c, the noise shaping circuit 14 disposed after the decimation circuit 12 includes an adder 14a, a subtractor 14b, a quantizer 14c, and a delay element 14d. Input to the noise shaping circuit 14 is connected to the adder 14a. An output of the adder 14a is connected to the subtractor 14b and the quantizer 14c. The quantizer 14c outputs a signal to outside of the FFB 1c and outputs a signal to the subtractor 14b. The subtractor 14b subtracts an output of the quantizer 14c from an output of the adder 14a and outputs a subtraction result to the delay element 14d. The delay element 14d is connected to the adder 14a.

With such a circuit configuration, the signal of two bits input from the decimation circuit 12 is input to the quantizer 14c and the subtractor 14b via the adder 14a. The quantizer 14c shifts bits of the signal of two bits to quantize the signal of two bits to a signal of one bit. The subtractor 14b subtracts a signal quantized by the quantizer 14c from a signal before being quantized by the quantizer 14c. By this means, the subtractor 14b outputs a remainder of quantization (quantization error) by the quantizer 14c to the delay element 14d. The delay element 14d delays the quantization error input from the subtractor 14b by one clock and outputs the delayed quantization error to the adder 14a. The adder 14a adds a quantization error of one preceding clock input from the delay element 14d to a signal newly input from the decimation circuit 12 and outputs the added signal.

As a result of the quantization error generated at the quantizer 14c being calculated by the subtractor 14b and fed back in this manner, shaping processing is performed in a similar manner to principle of ΔΣ modulation, which makes quantization noise unevenly distributed on a high frequency side and makes quantization noise smaller on a low frequency side.

Note that while FIG. 10 illustrates an example of a configuration where primary noise shaping is performed, quantization noise in the signal band may be further reduced by employing a configuration where higher-order noise shaping is performed so that quantization noise is more unevenly distributed on a high frequency side.

Figure 11:
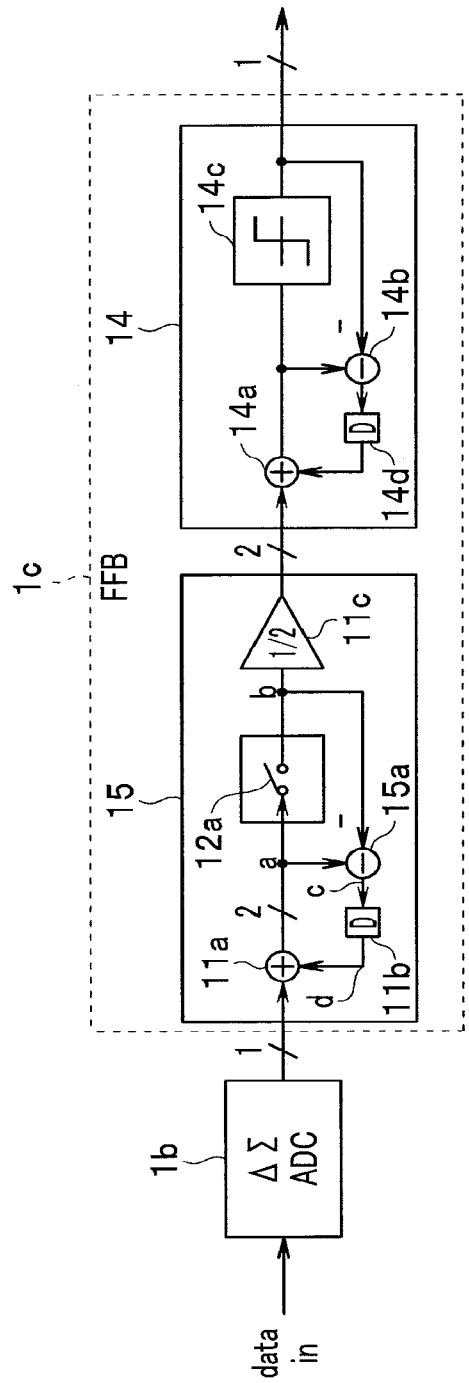
FIG. 11 is a view illustrating a second configuration example of the fast feedback processing circuit (FFB) according to the third embodiment.

FIG. 11 is a view illustrating a second configuration example of the fast feedback processing circuit (FFB) 1c according to the present embodiment. FIG. 11 illustrates a circuit obtained by transforming circuit topology of the circuit configuration in FIG. 10.

The FFB 1c in FIG. 11 includes an LPF decimation circuit 15, and a noise shaping circuit 14. The LPF decimation circuit 15 is a circuit in which the LPF 11 and the decimation circuit 12 connected in tandem in FIG. 10 are integrated. In FIG. 11, the same reference numerals will be assigned to circuit elements which are the same as the circuit elements in FIG. 10.

The LPF decimation circuit 15 includes an adder 11a, a delay element 11b, a ½-fold element 11c, a switch 12a, and a subtractor 15a. An input from the ΔΣ ADC 1b to the LPF decimation circuit 15 is connected to the adder 11a. An output of the adder 11a is connected to the switch 12a and the subtractor 15a by way of a terminal a. The switch 12a switches a state between ON and OFF for each clock. An output of the switch 12a is connected to the ½-fold element 11c and the subtractor 15a by way of a terminal b. The subtractor 15a subtracts an input by way of the terminal b from an input by way of the terminal a. An output of the subtractor 15a is output to the delay element 11b by way of a terminal c. The delay element 11b delays the input by one clock and outputs the delayed input. The output of the delay element 11b is connected to the adder 11a by way of a terminal d. The adder 11a adds an input from the ΔΣ ADC 1b and an input by way of the terminal d. The ½-fold element 11c multiplies the input by way of the terminal b by ½ through bit shift.

Operation of the LPF decimation circuit 15 having such a configuration will be described below. Note that to simplify notation, the output signal ΔΣ(k) of the ΔΣ ADC 1b is expressed as ΔΣ(k)=Ak in description of the operation of the LPF decimation circuit 15 in FIG. 11. A clock number k is k=1, 2, 3, 4, . . . . Further, signal values of the terminals a, b, c and d at the clock number k will be expressed as ak, bk, ck and dk.

It is assumed that in a case where k=1, the switch 12a is open, a value of the terminal b is 0 (b1=0), and a value of the terminal d is 0 (d1=0). Since d1=0, a value of the terminal a to which A1 is input from the ΔΣ ADC 1b becomes A1 (a1=A1). Since a1=A1, and b1=0, a value of the terminal c becomes A1 (c1=A1). Since b1=0, an output of the ½-fold element 11c is 0.

In a case where k=2, the switch 12a is closed, and a value of the terminal a is equal to a value of the terminal b (a2=b2). Since a2=b2, a value of the terminal c becomes 0 (c2=0). A value of the terminal d is c1 (=A1) of one preceding clock, and thus, d2=A1. A value of the terminal a to which A2 is input from the ΔΣ ADC 1b becomes a2=(A1+A2), and a value of the terminal b also becomes b2=(A1+A2) which is the same as a2. Since b2=(A1+A2), an output of the ½-fold element 11c is (A1+A2)/2.

In a case where k=3, the switch 12a is open again. It is assumed that a value of the terminal b is set at 0 (b3=0) in this event. A value of the terminal d is c2 (=0) of one preceding clock, and thus, d3=0. A value of the terminal a to which A3 is input from the ΔΣ ADC 1b becomes a3=A3. A value of the terminal c becomes c3=a3−b3=A3. Since b3=0, an output of the ½-fold element 11c is 0.

The switch 12a is closed again when k=4. In this event, a value of the terminal a is equal to a value of the terminal b (a4=b4). Since a4=b4, a value of the terminal c becomes 0 (c4=0). A value of the terminal d is c3 (=A3) of one preceding clock, and thus, d4=A3. A value of the terminal a to which A4 is input from the ΔΣ ADC 1b is a4=(A3+A4), and a value of the terminal b also becomes b4=(A3+A4) which is the same as a4. Since b4=(A3+A4), an output of the ½-fold element 11c is (A3+A4)/2.

By further performing the above-described operation in a similar manner, the LPF decimation circuit 15 decimates every other output average value of two successive clocks of the ΔΣ ADC 1b and outputs the decimated output average value to the noise shaping circuit 14. Thus, the LPF decimation circuit 15 in FIG. 11 is equivalent to a circuit which is a combination of the LPF 11 and the decimation circuit 12 in FIG. 10.

Figure 12:
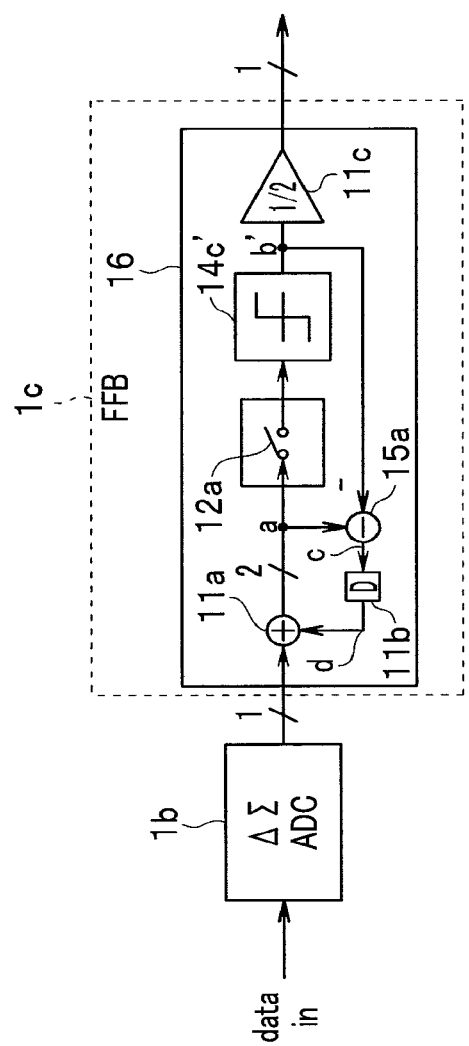
FIG. 12 is a view illustrating a third configuration example of the fast feedback processing circuit (FFB) according to the third embodiment.

FIG. 12 is a view illustrating a third configuration example of the fast feedback processing circuit (FFB) 1c according to the present embodiment. FIG. 12 is a circuit obtained by further transforming the circuit topology in FIG. 11.

The FFB 1c in FIG. 12 includes an LPF decimation noise shaping circuit 16. The LPF decimation noise shaping circuit 16 is a circuit in which the LPF decimation circuit 15 and the noise shaping circuit 14 connected in tandem in FIG. 11 are integrated. In FIG. 12, the same reference numerals will be assigned to circuit elements which are the same as the circuit elements in FIG. 10 and FIG. 11.

The LPF decimation noise shaping circuit 16 includes the adder 11a, the delay element 11b, the ½-fold element 11c, the switch 12a, a quantizer 14c' and the subtractor 15a. An input from the ΔΣ ADC 1b to the LPF decimation noise shaping circuit 16 is connected to the adder 11a. An output of the adder 11a is connected to the switch 12a and the subtractor 15a by way of the terminal a. The switch 12a switches a state between ON and OFF for each clock. An output of the switch 12a is connected to the quantizer 14c'. The quantizer 14c' quantizes a signal while setting 0 at a value of a lower-order bit by performing bit shift, for example, while combining right shift and left shift. Here, the quantized signal remains to be two bits. The quantizer 14c' is connected to the ½-fold element 11c and the subtractor 15a by way of a terminal b'. The subtractor 15a subtracts an input by way of the terminal b' from an input by way of the terminal a. A signal before quantization is input from the terminal a, and a signal after quantization is input from the terminal b', and thus, the subtractor 15a calculates and outputs a remainder (quantization error) of the quantization. An output of the subtractor 15a is output to the delay element 11b by way of the terminal c. The delay element 11b delays the input by one clock and outputs the delayed input. The output of the delay element 11b is connected to the adder 11a by way of the terminal d. The adder 11a adds an input from the ΔΣ ADC 1b and an input by way of the terminal d. Thus, the quantization error output from the subtractor 15a is added to an input signal of a next clock by the adder 11a. The ½-fold element 11c multiplies the input by way of the terminal b' by ½ through bit shift and outputs a result as a signal of one bit.

Operation of the LPF decimation noise shaping circuit 16 having the configuration in FIG. 12 conforms to the operation in FIG. 11, and thus, the operation will be simply described. Also in description of FIG. 12, ΔΣ(k) will be expressed as ΔΣ(k)=Ak.

If the switch 12a is open when k=1, A1 input to the adder 11a is stored in the delay element 11b, and the output of the ½-fold element 11c is 0.

If the switch 12a is closed when k=2, A2 input to the adder 11a and A1 from the delay element 11b are added, quantized by the quantizer 14c', bit-shifted (averaged) by the ½-fold element 11c and output. Further, a quantization error is calculated by subtracting (A1+A2) after quantization from (A1+A2) before quantization by the subtractor 15a and stored in the delay element 11b.

If the switch 12a is open when k=3, A3 input to the adder 11a is stored in the delay element 11b, and the output of the ½-fold element 11c is 0.

If the switch 12a is closed when k=4, A4 input to the adder 11a and A3 from the delay element 11b are added, quantized by the quantizer 14c', bit-shifted (averaged) by the ½-fold element 11c and output. Further, a quantization error is calculated by subtracting (A3+A4) after quantization from (A3+A4) before quantization by the subtractor 15a and stored in the delay element 11b.

By the quantization error generated at the quantizer 14c' being calculated by the subtractor 15a and fed back, shaping processing is performed in a similar manner to principle of ΔΣ modulation, which makes quantization noise unevenly distributed on a high frequency side and makes quantization noise smaller on a low frequency side.

Figure 13:
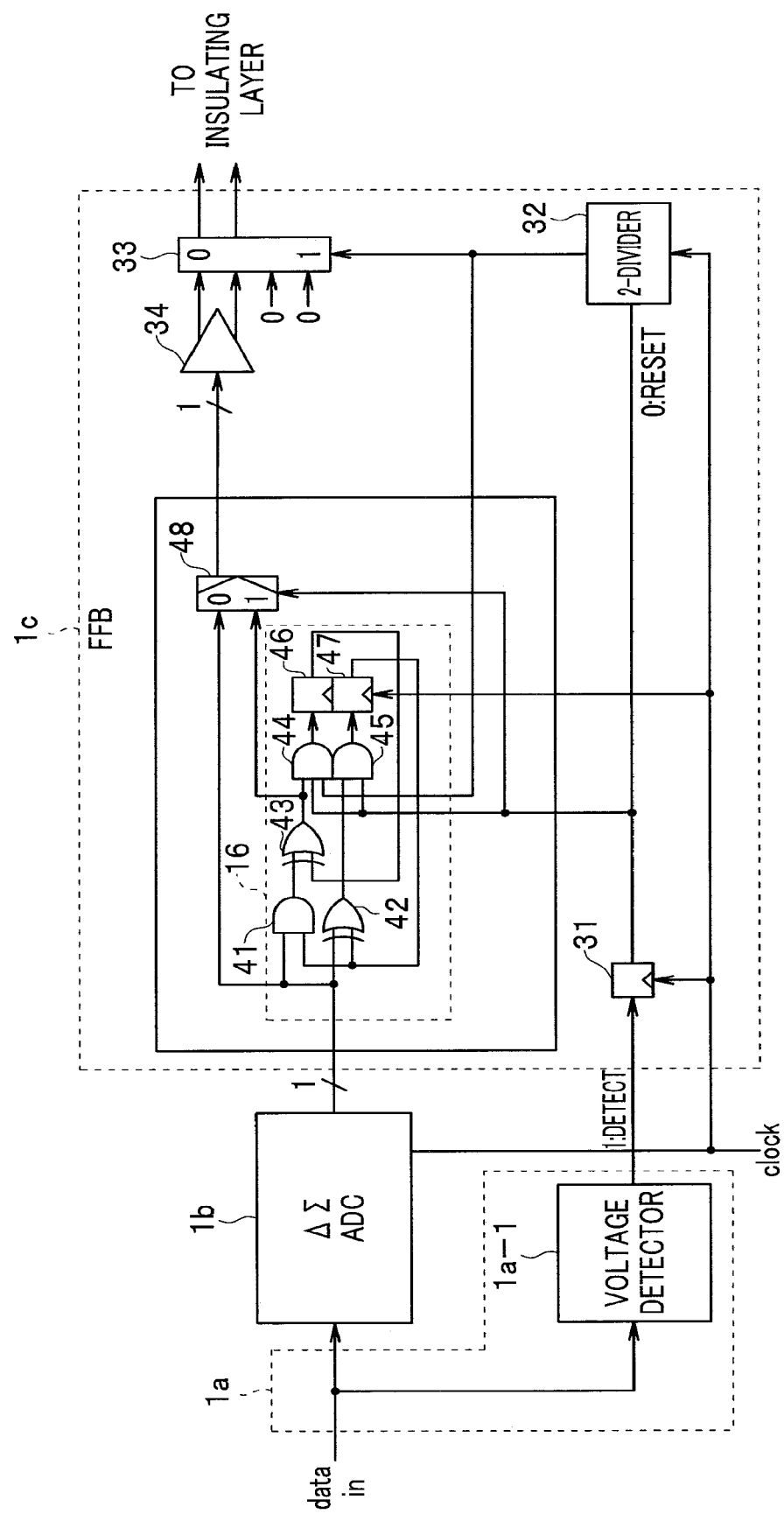
FIG. 13 is a view illustrating a configuration example using logic cells of the fast feedback processing circuit (FFB) in FIG. 12 according to the third embodiment.

FIG. 13 is a view illustrating a configuration example using logic cells of the fast feedback processing circuit (FFB) 1c in FIG. 12.

The input stage preamplifier and the abnormality detection circuit 1a include a voltage detector 1a-1.

The voltage detector 1a-1 determines whether the analog input signal is excessive input, and in a case where excessive input is detected, generates 1 as a determination signal $S_{FFB}$ and outputs the determination signal $S_{FFB}$ to a latch 31, and in a case where excessive input is not detected, generates 0 as the determination signal $S_{FFB}$ and outputs the determination signal $S_{FFB}$ to the latch 31.

The determination signal from the voltage detector 1a-1, and an internal clock (operation clock) are input to the latch 31. The latch 31 outputs the determination signal to a 2-divider 32, a 3-input AND gate 44, an AND gate 45 and a selector 48 in synchronization with the internal clock. Note that the internal clock is also input to the ΔΣ ADC 1b, a latch 46 and a latch 47 within the LPF decimation noise shaping circuit 16, and the 2-divider 32.

The 2-divider 32 multiplies a frequency of the internal clock by ½ and performs output in a case where the determination signal from the latch 31 is 1. Further, the 2-divider 32 is always reset and outputs 0 in a case where the determination signal from the latch 31 is 0.

The selector 48 is constituted with, for example, a multiplexer, and, in a case where the determination signal from the latch 31 is 0, outputs an input from the ΔΣ ADC 1b as is, and in a case where the determination signal from the latch 31 is 1, outputs a signal which is noise-shaped by the LPF decimation noise shaping circuit 16.

A differential output amplifier 34 converts a single end input from the selector 48 into a digital differential signal and outputs the digital differential signal. The differential output amplifier 34 outputs 1/0 (H/L) in a case where the output from the selector 48 is 1, and outputs 0/1 (L/H) in a case where the output from the selector 48 is 0.

The selector 33 is constituted with, for example, a multiplexer, and in a case where an output of the 2-divider 32 is 0 (in a case where excessive input does not occur), outputs a signal of the ΔΣ ADC 1b converted into the digital differential signal by the differential output amplifier 34 as is.

Further, the selector 33 alternately outputs the output from the differential output amplifier 34 and 0, 0 in a case where the output of the 2-divider 32 is a 2-frequency divided clock (in a case where excessive input occurs). In other words, the selector 33 outputs 0, 0 (an L/L signal of special data described above) in a case where the output of the 2-divider 32 is 1 (H), and outputs a data signal which is noise-shaped again (that is, noise-shaped by the ΔΣ ADC 1b and further noise-shaped by the noise shaping circuit 16) from the differential output amplifier 34 in a case where the output of the 2-divider 32 is 0 (L).

The LPF decimation noise shaping circuit 16 includes an AND gate 41, an XOR gate 42, an XOR gate 43, a 3-input AND gate 44, an AND gate 45, a latch 46, and a latch 47.

The output of the ΔΣ ADC 1b is input to the selector 48, the AND gate 41, and the XOR gate 42. An output of the AND gate 41 is input to the XOR gate 43. An output of the XOR gate 43 is input to the selector 48 and the 3-input AND gate 44. An output of the 3-input AND gate 44 is delayed by one clock by the latch 46 which functions as the delay element 11b and is output to the XOR gate 43. An output of the XOR gate 42 is input to the AND gate 45. An output of the AND gate 45 is delayed by one clock by the latch 47 which functions as the delay element 11b and is output to the AND gate 41 and the XOR gate 42.

The AND gate 41 processes a higher-order bit when an input of one bit from the ΔΣ ADC 1b is converted into two bits. The XOR gate 42 processes a lower-order bit when the input of one bit from the ΔΣ ADC 1b is converted into two bits.

The AND gate 41 outputs 1 in a case where the input from the ΔΣ ADC 1b is 1, and the output of the AND gate 45 of one preceding clock is 1, and outputs 0 in other cases. The XOR gate 42 outputs 1 in a case where one of the input from the ΔΣ ADC 1b and the output of the AND gate 45 of one preceding clock is 1, and outputs 0 in other cases.

In other words, in a case where the input from the ΔΣ ADC 1b is 0, (the output of the AND gate 41, the output of the XOR gate 42) representing (a higher-order bit, a lower-order bit) becomes (0, 0) in a case where the output of the AND gate 45 of one preceding clock is 0, and becomes (0, 1) in a case where the output of the AND gate 45 of one preceding clock is 1.

Further, in a case where the input from the ΔΣ ADC 1b is 1, (the output of the AND gate 41, the output of the XOR gate 42) becomes (0, 1) in a case where the output of the AND gate 45 of one preceding clock is 0, and becomes (1, 0) in a case where the output of the AND gate 45 of one preceding clock is 1.

The output of the AND gate 45 of one preceding clock is a quantization error as will be described later, and thus, it can be seen that the AND gate 41 and the XOR gate 42 function as the adder 11a which converts the input of one bit from the ΔΣ ADC 1b into two bits and adds the fed back quantization error.

The XOR gate 43 functions as the quantizer 14c' and the ½-fold element 11c, and outputs 1 in a case where one of the output of the AND gate 41 and the output of the latch 46 of one preceding clock is 1, and outputs 0 in other cases. The XOR gate 43 functions as the ½-fold element 11c by the XOR gate 43 which processes a higher-order bit of the signal of two bits being connected to the selector 48 and the lower-order bit being not connected to the selector 48.

The 3-input AND gate 44 outputs 1 in a case where the input from the XOR gate 43 is 1, the determination signal from the latch 31 is 1, and the output of the 2-divider 32 is 1, and outputs 0 in other cases. The 2-frequency divided clock of the 2-divider 32 is input to the 3-input AND gate 44 which processes a higher-order bit of the LPF decimation noise shaping circuit 16 to perform subtraction upon noise shaping. The 3-input AND gate 44 outputs the input from the XOR gate 43 at a ratio of once every two clocks at an internal clock in a case where excessive input is detected (in a case where the determination signal from the latch 31 is 1).

The AND gate 45 outputs 1 in a case where the input from the XOR gate 42 is 1, and the determination signal from the latch 31 is 1, and outputs 0 in other cases. Thus, the AND gate 45 outputs the input from the XOR gate 42 (that is, a lower-order bit of the output of the adder 11a) in a case where excessive input is detected (in a case where the determination signal from the latch 31 is 1). The output of the XOR gate 42 becomes a lower-order bit of a signal of two bits obtained by adding a quantization error of one preceding clock fed back from the latch 47 to the output of the ΔΣ ADC 1b. Thus, the output of the XOR gate 42 becomes a quantization error of the current clock. With such a configuration, the quantization error is fed back to the adder 11a which is constituted with the AND gate 41 and the XOR gate 42.

Figure 14:
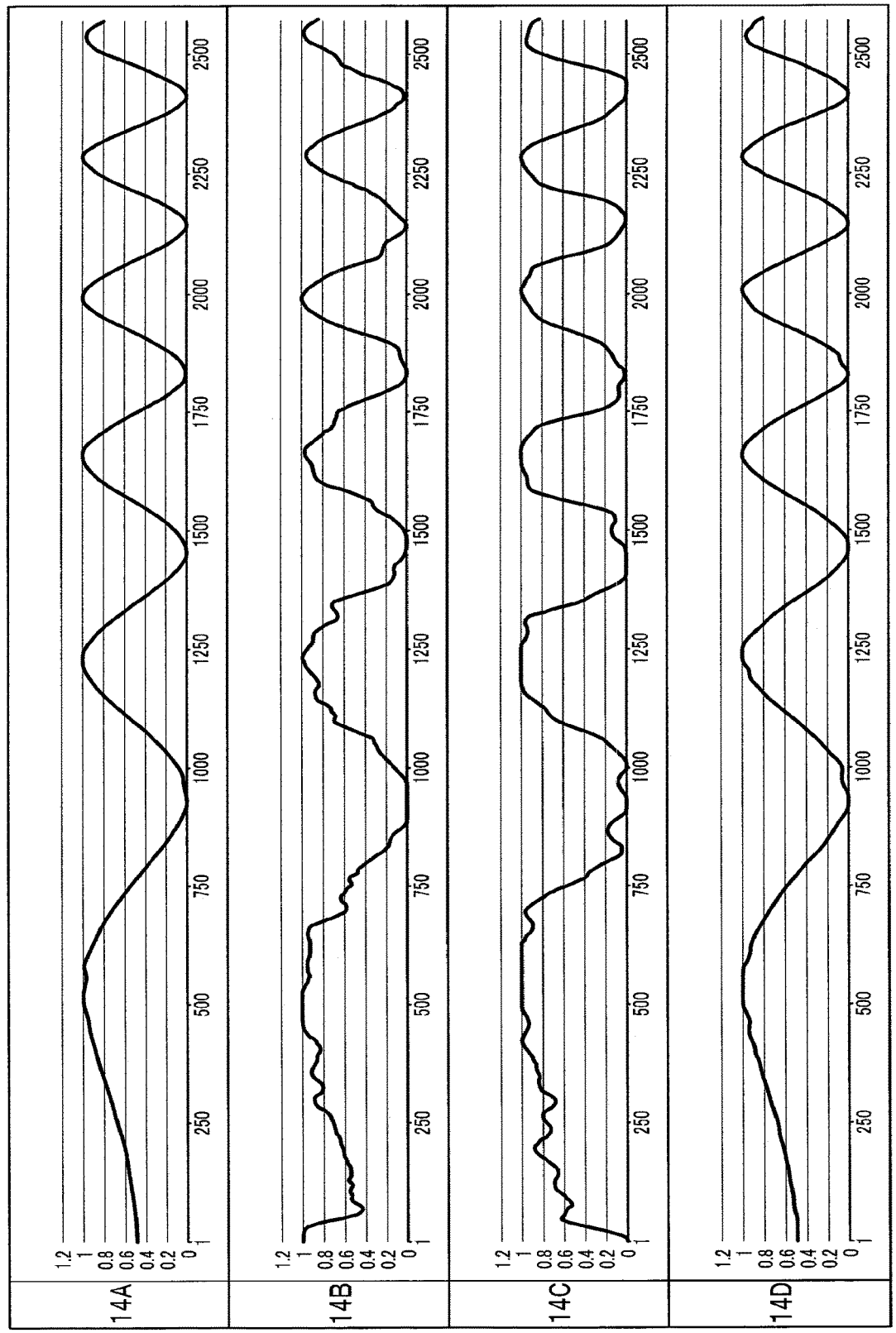
FIG. 14 is graphs indicating simulation results of no decimation (14A), simple decimation (14B), a configuration in FIG. 8 of the second embodiment (14C) and a configuration in FIG. 9 of the third embodiment (14D) according to the first to the third embodiments.

FIG. 14 is graphs indicating simulation results of no decimation (14A), simple decimation (14B), a configuration in FIG. 8 of the second embodiment (14C), and a configuration in FIG. 9 of the third embodiment (14D). FIG. 14 indicates a clock number (time) on a horizontal axis and indicates a relative signal amplitude (a maximum value of the signal amplitude is normalized to 1) on a vertical axis.

In the simulation results in FIG. 14, a primary ΔΣ ADC is set to the ΔΣ ADC, and a secondary cascaded integrator comb (CIC) filter is set to an LPF in a final stage in FIG. 9. Further, FIG. 14 illustrates examples of the simulation results in a case where a chart signal (signal in which frequency characteristics in a predetermined band are taken into account) having a frequency which becomes gradually higher as time proceeds as an input signal. Thus, a portion with a small clock number indicates a result of a low-frequency portion close to a direct current (DC), and a portion with a large clock number indicates a result of a higher-frequency portion.

FIG. 14B illustrates a simulation result by simple decimation in a case where the LPF 11 and the quantizer 13 are not provided in the configuration of the FFB 1b illustrated in FIG. 7 and FIG. 8. It can be seen from FIG. 14B that the SNR substantially degrades in, particularly, a low-frequency portion close to a DC compared to no decimation in FIG. 14A. In other words, the LPF 2g generates an output to the output terminals OUTP and OUTN after replacing data of decimated clocks with data of preceding clocks in the output of the ΔΣ ADC 1b which is simply decimated every other clock, and thus, particularly large distortion occurs in a signal in a low-frequency portion close to a DC in which the input signal gently changes.

It can be seen that, in the simulation result illustrated in FIG. 14C in a case where the FFB 1c in FIG. 8 is used, the SNR cannot be prevented from substantially degrading compared to no decimation in FIG. 14A in a low-frequency portion close to a DC in a similar manner to FIG. 14B.

On the other hand, it can be seen that, in the simulation result illustrated in FIG. 14D in a case where the FFB 1c in FIG. 9 is used, the SNR is higher than the SNR in FIG. 14B and FIG. 14C from a low-frequency portion to a high-frequency portion.

According to the third embodiment, it is possible to provide effects substantially similar to the effects of the above-described second embodiment, and as a result of replacing the quantizer 13 in the second embodiment with the noise shaping circuit 14, it is possible to make quantization noise more unevenly distributed on a high frequency side and reduce quantization noise in a signal band. This can further prevent degradation of signal accuracy.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. An isolator comprising:
an analog-digital converter configured to convert an analog input signal into a digital signal and transmit the digital signal as normal data;
a time direction multiplexing circuit configured to perform time direction multiplexing of alternately performing conversion of the normal data from the analog-digital converter into a digital differential signal and transmission of the digital differential signal, and transmission of a special signal different from an output of the analog-digital converter; and
an insulated transmission circuit configured to transmit the digital differential signal and the special signal transmitted from the time direction multiplexing circuit via an insulating layer.

2. The isolator according to claim 1,
wherein there are m types of the special signal, where m is an integer equal to or greater than 2, and
the time direction multiplexing circuit alternately performs conversion of the normal data into the digital differential signal and transmission of the digital differential signal in one operation clock, and transmission of the m types of the special signal in m operation clocks.

3. The isolator according to claim 1, further comprising:
an abnormality detection circuit configured to determine whether or not an amplitude of the analog input signal exceeds an excessive input threshold and generate a determination signal indicating a determination result,
wherein the time direction multiplexing circuit
receives the determination signal,
in a case where the determination signal indicates that the amplitude of the analog input signal does not exceed the excessive input threshold, converts the normal data from the analog-digital converter into a digital differential signal and transmits the digital differential signal to the insulated transmission circuit, and
in a case where the determination signal indicates that the amplitude of the analog input signal exceeds the excessive input threshold, transmits the digital differential signal and the special signal which are subjected to the time direction multiplexing to the insulated transmission circuit.

4. The isolator according to claim 3, wherein
the analog-digital converter is configured to convert the analog input signal into a digital signal of one bit as the normal data,
the time direction multiplexing circuit comprises:
a 2-divider configured to receive the determination signal and multiply a frequency of an operation clock by ½ and output the operation clock in a case where the determination signal indicates that the amplitude of the analog input signal exceeds the excessive input threshold;
a first AND gate configured to receive the normal data from the analog-digital converter;
a first XOR gate connected to the first AND gate in parallel and configured to receive the normal data from the analog-digital converter;
a second XOR gate configured to receive an output of the first AND gate;
a 3-input AND gate configured to receive an output of the second XOR gate, an output of the 2-divider and the determination signal;
a second AND gate configured to receive an output of the first XOR gate and the determination signal;
a first latch configured to receive an output of the 3-input AND gate and the operation clock; and
a second latch configured to receive an output of the second AND gate and the operation clock,
wherein an output of the first latch is input to the second XOR gate, and
an output of the second latch is input to the first AND gate and the first XOR gate.

5. The isolator according to claim 4,
wherein the time direction multiplexing circuit further comprises:
a first selector to which the normal data from the analog-digital converter, the output of the second XOR gate and the determination signal are connected,
wherein the first selector selects and outputs the normal data from the analog-digital converter in a case where the determination signal indicates that the amplitude of the analog input signal does not exceed the excessive input threshold, and
selects and outputs the output of the second XOR gate in a case where the determination signal indicates that the amplitude of the analog input signal exceeds the excessive input threshold.

6. The isolator according to claim 5,
wherein the time direction multiplexing circuit further comprises:
a differential output amplifier configured to convert an output from the first selector into the digital differential signal; and
a second selector to which the digital differential signal from the differential output amplifier, the special signal, and the output of the 2-divider are connected,
wherein the 2-divider is always reset and outputs 0 in a case where the determination signal indicates that the amplitude of the analog input signal does not exceed the excessive input threshold, and
the second selector outputs the digital differential signal from the differential output amplifier in a case where the output of the 2-divider is 0, and
alternately outputs the digital differential signal from the differential output amplifier and the special signal in a case where the output of the 2-divider is an output in which a frequency of the operation clock is multiplied by ½.

7. The isolator according to claim 1,
wherein the time direction multiplexing circuit comprises:
a low-pass filter circuit configured to perform low-pass filter processing on the normal data from the analog-digital converter; and
a decimation circuit and a quantizer configured to decimate the normal data of a plurality of bits subjected to the low-pass filter processing by the decimation circuit before or after quantizing the normal data of the plurality of bits subjected to the low-pass filter processing into one bit by the quantizer.

8. The isolator according to claim 1,
wherein the time direction multiplexing circuit comprises:
a low-pass filter circuit configured to perform low-pass filter processing on the normal data from the analog-digital converter;

a decimation circuit configured to decimate the normal data of a plurality of bits subjected to the low-pass filter processing; and a noise shaping circuit configured to perform noise shaping processing of quantizing the normal data of the plurality of bits decimated by the decimation circuit to one bit and adding a quantization error upon quantization to next normal data of a plurality of bits to make quantization noise unevenly distributed on a high frequency side.

9. The isolator according to claim 8, wherein the noise shaping circuit comprises:

an adder to which the normal data of the plurality of bits decimated by the decimation circuit is input;

a quantizer configured to quantize an output of the adder;

a subtractor configured to subtract the output quantized by the quantizer from the output of the adder; and a delay element configured to delay an output of the subtractor, and an output of the delay element is input to the adder and added to the normal data of the plurality of bits by the adder.

* * * * *